(12) United States Patent
Solan

(10) Patent No.: US 9,059,577 B2
(45) Date of Patent: *Jun. 16, 2015

(54) FLUSH MOUNT ELECTRICAL PLATE AND METHOD FOR INSTALLING SAME

(71) Applicant: Denis Solan, Fairfax, CA (US)

(72) Inventor: Denis Solan, Fairfax, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/109,125

(22) Filed: Dec. 17, 2013

(65) Prior Publication Data

US 2014/0102779 A1 Apr. 17, 2014

Related U.S. Application Data

(63) Continuation of application No. 12/945,163, filed on Nov. 12, 2010, now Pat. No. 8,610,004, which is a continuation-in-part of application No. 12/504,174, filed on Jul. 16, 2009, now Pat. No. 8,058,570.

(60) Provisional application No. 61/081,598, filed on Jul. 17, 2008.

(51) Int. Cl.
H02G 3/12 (2006.01)
H02G 3/08 (2006.01)
H01H 13/04 (2006.01)
H02B 1/30 (2006.01)
H05K 5/00 (2006.01)
H05K 7/14 (2006.01)
H01S 4/00 (2006.01)
B21D 39/03 (2006.01)
H02G 3/14 (2006.01)
H05K 13/04 (2006.01)
H02G 3/00 (2006.01)

(52) U.S. Cl.
CPC ............. H02G 3/12 (2013.01); Y10T 29/49002 (2015.01); H02G 3/00 (2013.01); H02G 3/123 (2013.01); H02G 3/14 (2013.01); H05K 13/04 (2013.01)

(58) Field of Classification Search
USPC ........... 174/50, 58, 61, 63, 64, 502, 535, 559, 174/560; 29/428, 592.1
See application file for complete search history.

(56) References Cited

U.S. PATENT DOCUMENTS 1,455,399 A 5/1923 Keavaney
2,218,731 A 10/1940 Tuck et al.
3,530,230 A 9/1970 Cormier et al.
(Continued)

FOREIGN PATENT DOCUMENTS

JP 07-288913 A 10/1995

OTHER PUBLICATIONS

PCT International Search Report and Written Opinion for PCT/US2009/050948 dated Feb. 3, 2010, 7 pgs.

Primary Examiner — Timothy Thompson
Assistant Examiner — Sherman Ng
(74) Attorney, Agent, or Firm — Harness, Dickey & Pierce, P.L.C.

(57) ABSTRACT

A mounting tray for a supporting and electrical component relative to an opening in a wall can include a rear wall that defines an opening. A sidewall can extend outwardly from the rear wall and collectively define a pocket with the rear wall. The sidewall can have an outer lip. An outer flange can extend around the sidewall at a position intermediate to the outer lip and the rear wall from a first location at the sidewall to a second location at an outer perimeter. The outer perimeter of the outer flange is offset inboard of the opening in the wall in an installed position.

6 Claims, 12 Drawing Sheets

(56) References Cited

U.S. PATENT DOCUMENTS

| | | |
|---|---|---|
| 3,544,703 A | 12/1970 | Jones |
| 4,090,769 A | 5/1978 | Damsky |
| 4,289,921 A | 9/1981 | Gartner et al. |
| 4,296,870 A | 10/1981 | Balkwill et al. |
| 4,794,207 A | 12/1988 | Norberg et al. |
| 4,918,259 A | 4/1990 | Hanson |
| 4,936,794 A | 6/1990 | Shaw et al. |
| 5,012,043 A | 4/1991 | Seymour |
| 5,135,411 A | 8/1992 | Wiley et al. |
| 5,171,939 A | 12/1992 | Shotey |
| 5,257,946 A | 11/1993 | MacMillan et al. |
| 5,272,281 A | 12/1993 | Bouley |
| 5,280,135 A | 1/1994 | Berlin et al. |
| 5,287,665 A | 2/1994 | Rath, Jr. |
| 5,387,761 A | 2/1995 | Simonis |
| 5,448,011 A | 9/1995 | Laughlin |
| 5,574,256 A | 11/1996 | Cottone |
| 5,775,032 A | 7/1998 | Lacy |
| 5,839,241 A | 11/1998 | Cacossa et al. |
| D410,898 S | 6/1999 | Lin |
| 5,913,439 A | 6/1999 | Von Arx |
| 6,239,365 B1 | 5/2001 | McEvers |
| 6,281,434 B1 | 8/2001 | Gretz |
| 6,281,438 B1 | 8/2001 | Desilets et al. |
| 6,355,880 B1 | 3/2002 | Bateson et al. |
| 6,359,219 B1 | 3/2002 | Reid et al. |
| 6,369,322 B1 | 4/2002 | Gretz |
| 6,419,102 B1 | 7/2002 | Harpenau |
| 6,435,903 B1 | 8/2002 | Nelson |
| 6,596,938 B2 | 7/2003 | Gilleran |
| 6,875,937 B1 | 4/2005 | Saviano |
| 6,908,003 B2 | 6/2005 | Feyes et al. |
| 6,931,794 B1 | 8/2005 | Burgess |
| 6,956,169 B1 | 10/2005 | Shotey et al. |
| 6,956,171 B1 | 10/2005 | Gretz |
| 6,965,078 B1 | 11/2005 | Gretz |
| 7,005,578 B2 | 2/2006 | Gretz |
| 7,044,318 B2 | 5/2006 | Gates, II |
| 7,045,713 B1 | 5/2006 | Gretz |
| 7,064,271 B1 | 6/2006 | Gretz |
| 7,087,837 B1 | 8/2006 | Gretz |
| 7,115,820 B1 | 10/2006 | Gretz |
| 7,119,277 B1 | 10/2006 | Shotey et al. |
| 7,122,740 B2 | 10/2006 | Xu et al. |
| 7,151,219 B1 | 12/2006 | Gretz |
| 7,166,801 B1 | 1/2007 | Gretz |
| 7,176,377 B1 | 2/2007 | Gretz |
| 7,294,781 B1 | 11/2007 | Gretz |
| 7,307,212 B1 | 12/2007 | Gretz et al. |
| 7,732,715 B2 | 6/2010 | Paolucci |
| 2003/0089710 A1 | 5/2003 | Gates |
| 2008/0006624 A1 | 1/2008 | Davis |
| 2008/0110661 A1 | 5/2008 | Dinh |
| 2008/0144302 A1 | 6/2008 | Rosenblatt |
| 2008/0168722 A1 | 7/2008 | Hendricks |
| 2008/0223600 A1 | 9/2008 | Magno |
| 2009/0249705 A1 | 10/2009 | Struthers et al. |

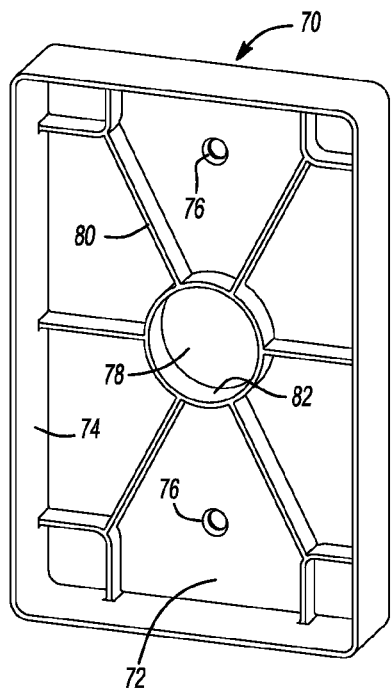
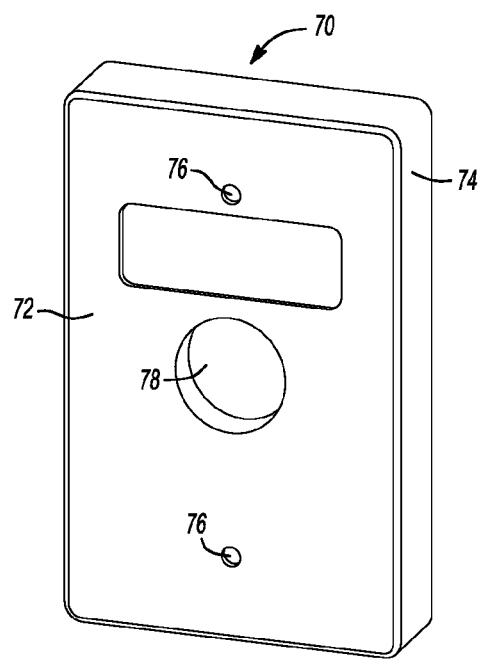
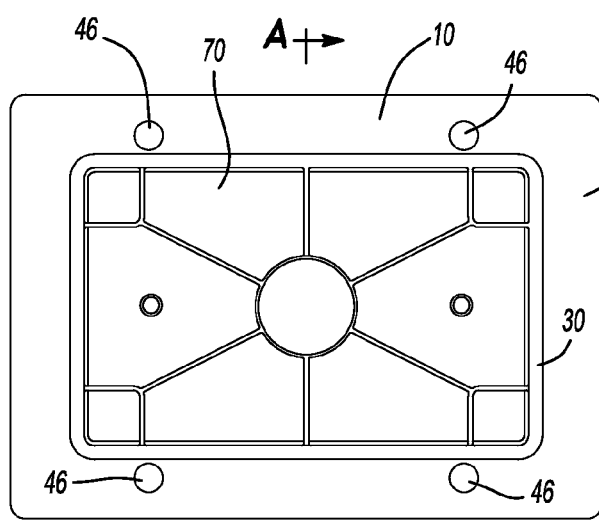
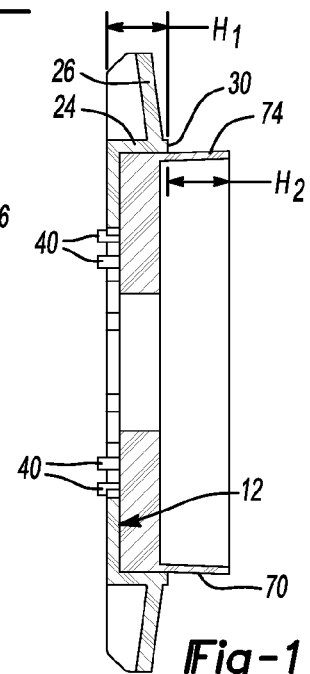
Fig-7
Fig-8
Fig-9
Fig-10A

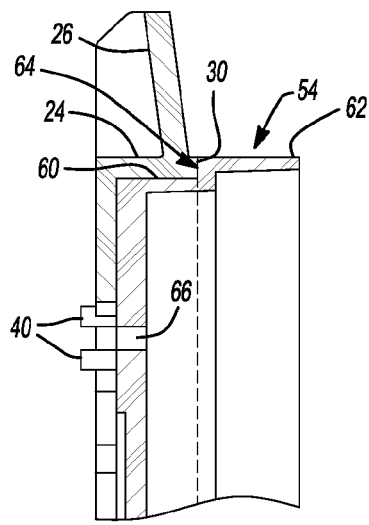
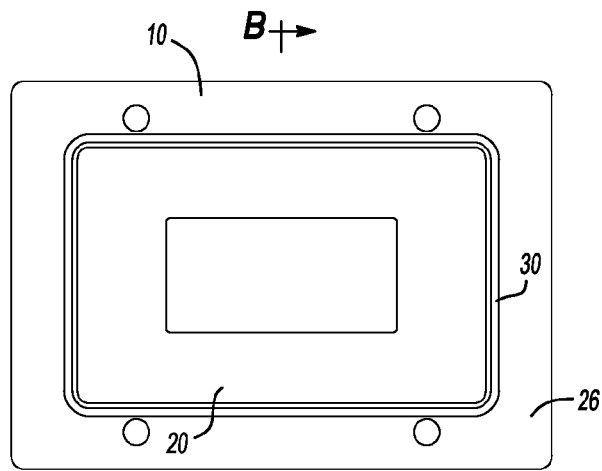
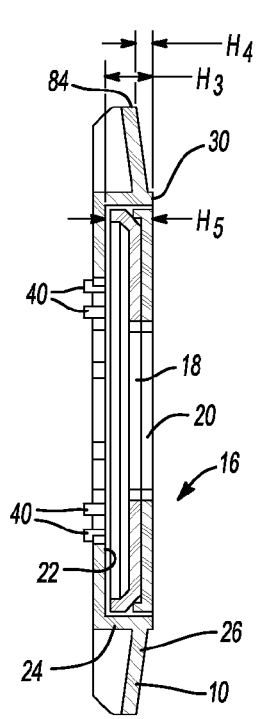
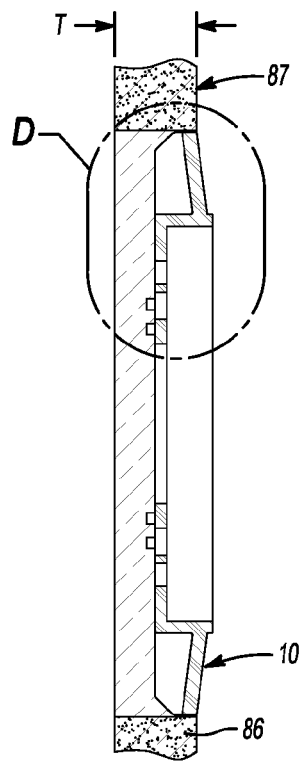
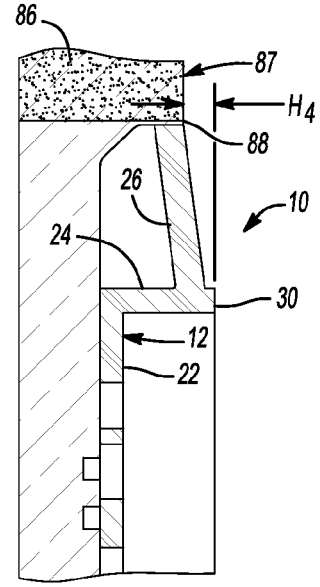
Fig-10B
Fig-11
Fig-12
Fig-13
Fig-14

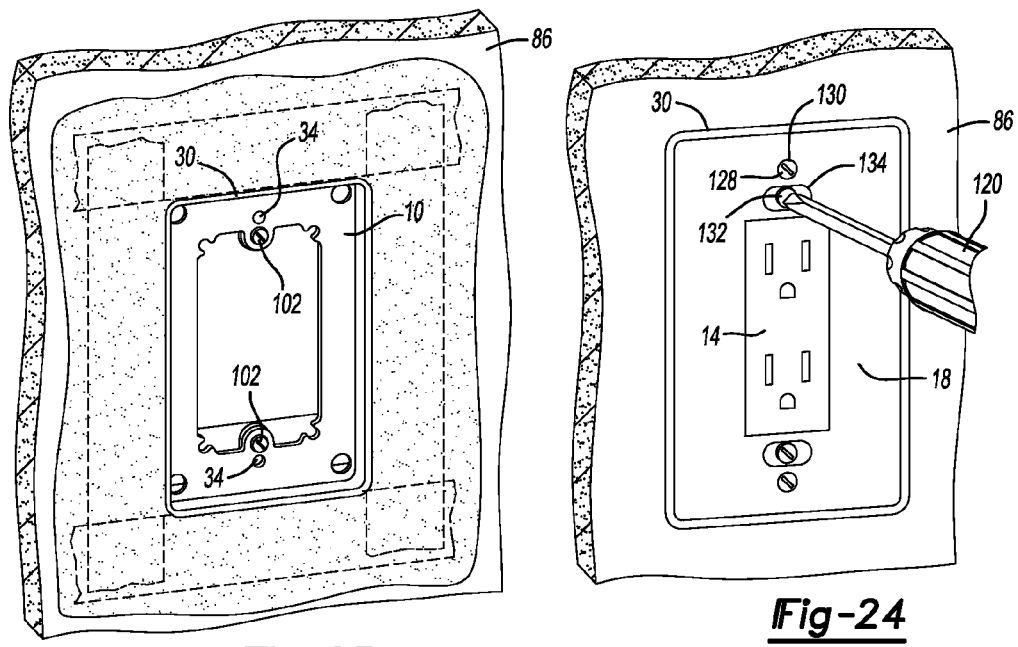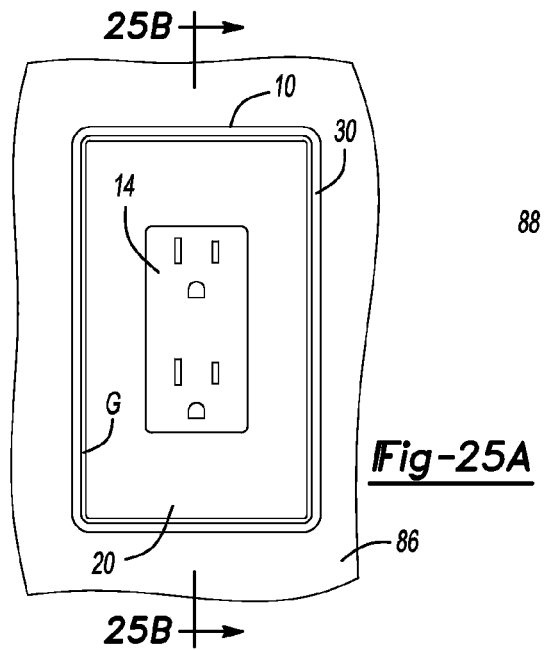

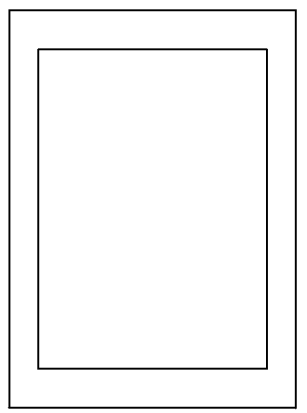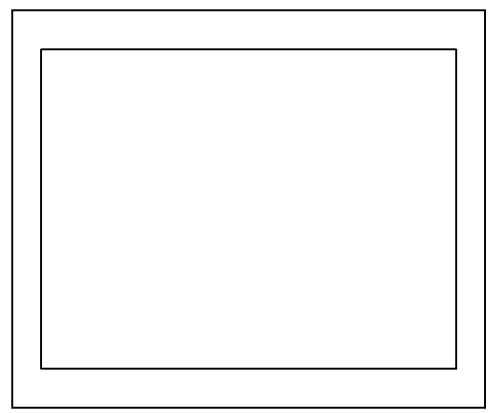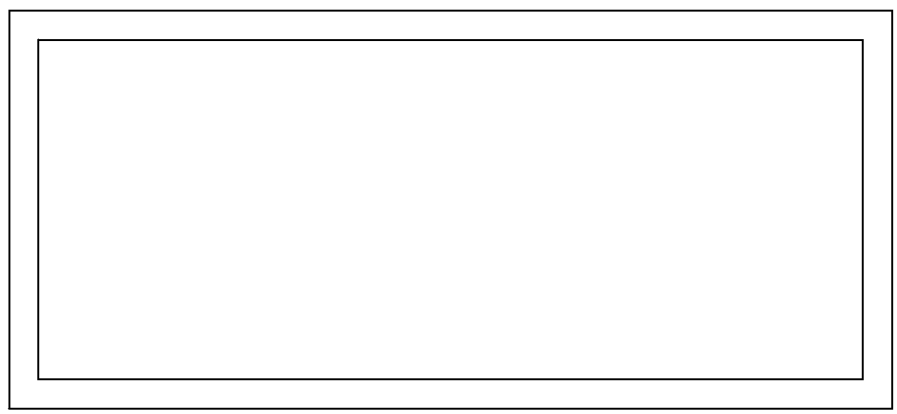
Fig-29

FLUSH MOUNT ELECTRICAL PLATE AND METHOD FOR INSTALLING SAME

CROSS-REFERENCE TO RELATED APPLICATIONS

This application is a continuation of U.S. patent application Ser. No. 12/945,163 filed on Nov. 12, 2010, which is a continuation-in-part of U.S. patent application Ser. No. 12/504,174 (now U.S. Pat. No. 8,058,570) filed on Jul. 16, 2009, which claims the benefit and priority of 61/081,598, filed Jul. 17, 2008. The entire disclosure of the above application is incorporated herein by reference.

FIELD

The present disclosure relates to a mounting plate for mounting electrical components such as switch plates in a substantially flush orientation relative to a surrounding surface such as a wall.

BACKGROUND

The statements in this section merely provide background information related to the present disclosure and may not constitute prior art.

Electrical components such as electrical switches, sockets and the like are typically provided on walls of commercial and residential buildings as is well known in the art. Electrical switches for example tend to be installed on the wall at a height convenient for a user to easily manipulate. In many examples, sockets and other outlets such as cable TV jacks for example tend to be installed lower on the wall. Nevertheless, in either case, a cover plate is typically provided that is secured around the switch (socket etc.) to provide a transition from the switch to the surrounding wall. Such cover plates can protrude outwardly relative to the wall. In some examples this configuration can lead to an unfinished appearance.

SUMMARY

A mounting tray for a supporting and electrical component relative to an opening in a wall can include a rear wall that defines an opening. A sidewall can extend outwardly from the rear wall and collectively define a pocket with the rear wall. The sidewall can have an outer lip. An outer flange can extend around the sidewall at a position intermediate the outer lip and the rear wall from a first location at the sidewall to a second location at an outer perimeter. The outer perimeter of the outer flange is offset inboard of the opening in the wall in an installed position.

According to other features, at least two locating posts can be formed on the rear wall. The locating posts can extend generally in a direction away from the pocket. The locating posts can be spaced relative to each other, so as to engage a mud ring that supports the mounting tray in an installed position. At least two alignment apertures can be formed through the outer flange. The alignment apertures can be spaced to permit tool access therethrough so as to engage set screws associated with a mud ring that supports the mounting tray in the installed position. The outer flange can extend orthogonally relative to the sidewall.

At least one cutout can be formed in the rear wall. The cutout can be aligned for gaining access to a fastener associated with an adjustable electrical box. The outer perimeter of the flange can be offset inboard of the opening, such that during installation, tape can be applied across the wall, across a transition between the wall and the outer flange, and onto the outer flange. The lip can extend generally orthogonal relative to the wall in the installed position, such that setting compound can be applied from an outer boundary of the lip, over the tape and along an area of the wall outside of a boundary defined by the tape.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 7 is a front perspective view of a cap constructed in accordance with another example of the present teachings;

FIG. 8 is a rear perspective view of the cap of FIG. 7;

FIG. 9 is a plan view of the mounting plate of FIG. 1 and shown with the cap of FIG. 7 in an assembled position;

FIG. 10A is a cross-sectional view of the mounting plate and cap assembly taken along lines A-A of FIG. 9;

FIG. 10B is a cross-sectional view of the mounting plate shown with the cap of FIG. 6;

FIG. 11 is a plan view of the mounting plate of FIG. 1 and shown with an exemplary electrical plate assembly;

FIG. 12 is a cross-sectional view of the mounting plate and electrical plate assembly taken along line B-B of FIG. 11;

FIG. 13 is a cross-sectional view of the mounting plate of FIG. 1 and shown installed within an opening of an exemplary wall according to the present disclosure;

FIG. 14 is a detailed view of area D of FIG. 13;

FIG. 23 is another front perspective view of the mounting plate in an installed position and shown with the setting compound applied and after a sanding step;

FIG. 24 is a front perspective view of an exemplary electrical component and inner plate being secured relative to the mounting plate with a tool;

FIG. 25A is a front perspective view of the exemplary electrical component installed relative to the mounting plate and having an outer plate secured onto the inner plate of the electrical plate assembly;

FIG. 25B is a cross-sectional view taken along lines 25B-25B of FIG. 25A;

FIG. 29 is a collection of an exemplary mounting tray provided in one, two and multiple gang configurations according to the present disclosure;

DETAILED DESCRIPTION

Figure 1:
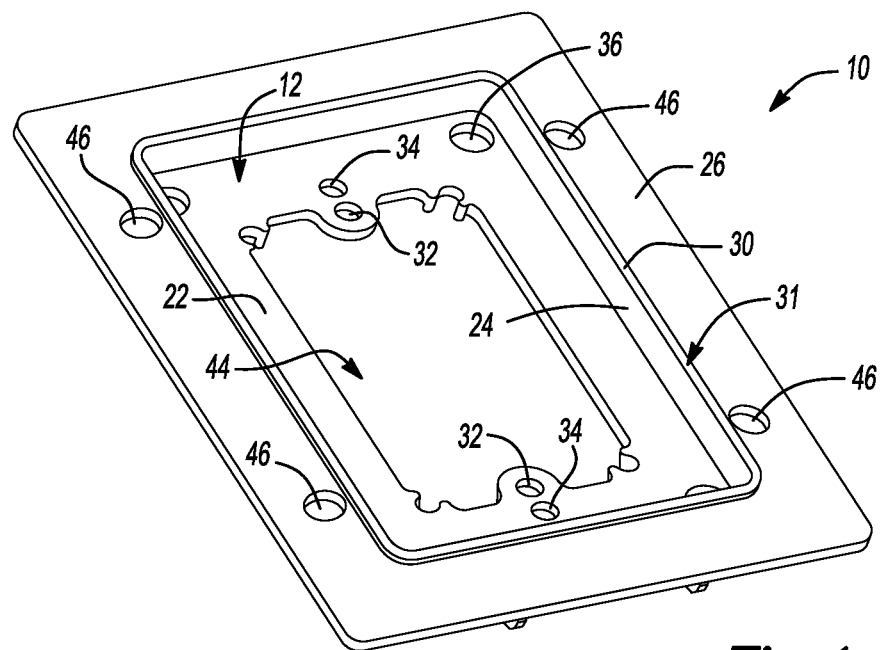
FIG. 1 is a front perspective view of a mounting tray according to one example of the present disclosure.
Figure 2:
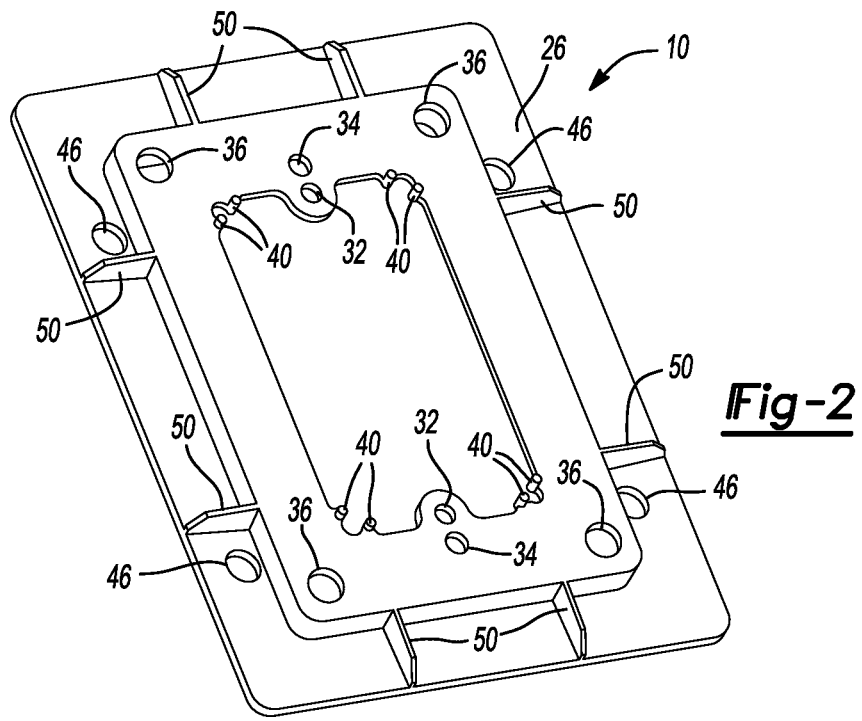
FIG. 2 is a rear perspective view of the mounting tray of FIG. 1.
Figure 3:
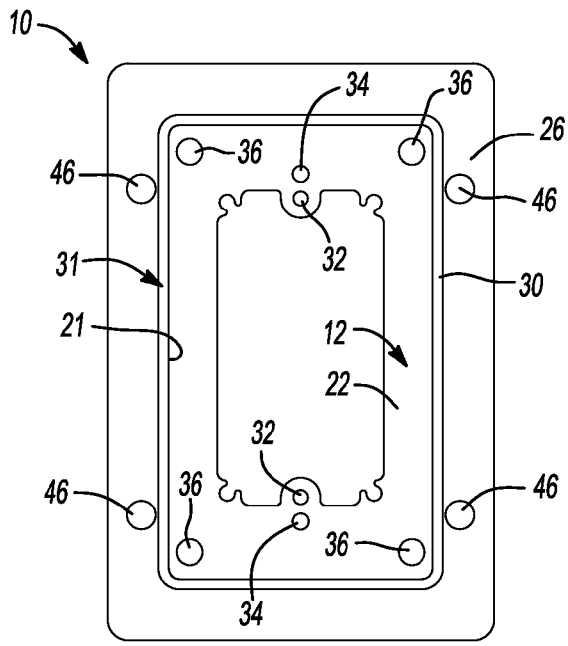
FIG. 3 is a plan view of the mounting tray of FIG. 1.
Figure 4:
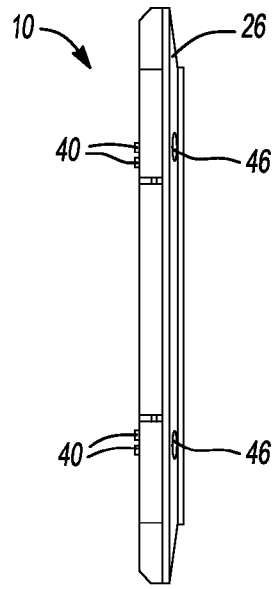
FIG. 4 is a side view of the mounting tray of FIG. 1.
Figure 5:
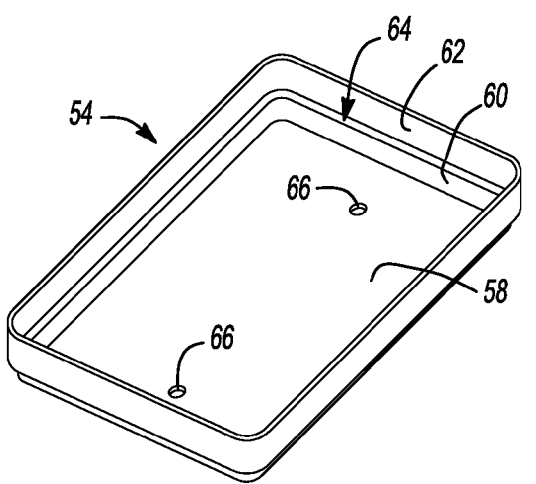
FIG. 5 is a front perspective view of a cap according to a first example, the cap being configured to selectively mate with the mounting tray of FIG. 1.
Figure 6:
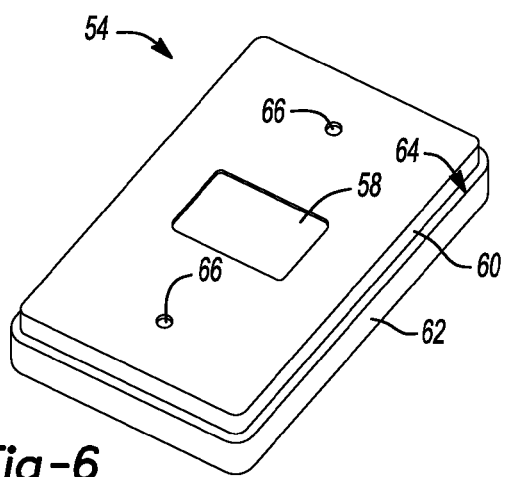
FIG. 6 is a rear perspective view of the cap of FIG. 5.

With initial reference to FIGS. 1-4, a mounting tray constructed in accordance to the present teachings is shown and generally identified at reference numeral 10. As will be described, the mounting tray 10 is configured to support an electrical component relative to an opening in a wall (or other flat surfaces such as, but not limited to, a ceiling or a floor). In general, the mounting tray 10 can define a pocket 12 that can receive an electrical component in a position to remain generally unexposed from the surface of the wall. Once installed, the mounting tray 10 can provide a smooth, uninterrupted finish with an almost non-existent seam between the electrical component and the surrounding wall (see e.g., FIG. 26). As used herein, the term electrical component is used to define any electrical component singly or in any combination, such as an electrical outlet 14 (FIG. 26) and an electrical component plate assembly 16 (FIG. 12) having an inboard plate 18 and an outboard plate 20.

The mounting tray 10 can include a rear wall 22, a sidewall 24, and a flange 26. In one example, the sidewall 24 can define two pair of opposing walls that collectively form a rectangular shape. The sidewall 24 can extend generally transverse to a plane defined by the rear wall 22. In one example, the rear wall 22 and the sidewall 24 can collectively define the pocket 12. The sidewall 24 can define a lip 30 that generally projects away from and extends above the flange 26. The lip 30 defines an outer face 31. The rear wall 22 can further define a first and second pair of mounting passages 32 and 34, respectively. A first plurality of apertures 36 can be defined through the rear wall 22 generally at corners defined by the pocket 12. A plurality of locating posts 40 (FIG. 2) can be formed on the rear wall 22 and extend in a direction generally away from the pocket 12. In one example, a pair of locating posts 40 is provided in each of the corners defined by the pocket 12. An opening 44 can be defined through the rear wall 22. A plurality of alignment apertures 46 can be defined through the flange 26. A plurality of support members 50 (FIG. 2) can be formed on the mounting tray 10 that extend between the sidewall 24 and the flange 26.

Turning now to FIGS. 5-8, 10A and 10B, a cap 54 constructed in accordance to one example of the present teachings is shown. As will become appreciated, the cap 54 can be used to selectively mate with the mounting tray 10 within the pocket 12 during installation of the mounting tray 10 to substantially inhibit material, such as settable compounds from entering the pocket 12. The cap 54 can generally define a rear face 58, an inboard wall 60 and an outboard wall 62. In one example, the inboard wall 60 and the outboard wall 62 are generally parallel and offset with respect to each other. A ledge 64 can be defined between the inboard wall 60 and the outboard wall 62. In one example, the ledge 64 can be substantially parallel with the rear face 58. A pair of mounting apertures 66 can be defined through the rear face 58.

Turning now to FIGS. 7 and 8, a cap 70 constructed in accordance to additional features is shown. The cap 70 generally defines a rear face 72 and an outboard wall 74. The rear face 72 can define mounting apertures 76 and a central bore 78. A plurality of ribs 80 can be formed on the rear face 72 and generally extend between the outer wall 74 and a cylindrical wall 82 extending from the bore 78. With continued reference to FIGS. 7 and 8 and additional reference now to FIGS. 9 and 10, the cap 70 will be described in a mating relationship with respect to the mounting tray 10. While the following description is specifically directed toward the cap 70, it is appreciated that a similar arrangement can be achieved by using the cap 54 described above in relation to FIGS. 5 and 6. Once the desired orientation of the mounting plate 10 with respect to the surrounding wall is obtained (as will be described in greater detail later), the cap 70 can be inserted into the pocket 12 as shown in FIG. 10A. In one example, fasteners may be inserted through the apertures 76 of the cap 70 and into one of the mounting passages 32 or 34 of the mounting tray 10. As shown in FIG. 10B, use of the cap 54 (FIGS. 5 and 6), can result in the ledge 64 resting atop of the lip 30 (i.e., on the lip face 31).

As illustrated in FIG. 10A, the sidewall 24 can define a height $H_1$. The outer wall 74 can define an exposed height $H_2$. The exposed height $H_2$ is defined from the outer face 31 of the lip 30. By way of example, the height $H_1$ can be about 0.435 inch and the height $H_2$ can be about 0.445 inch. It is appreciated by those skilled in the art that these dimensions are merely exemplary and can define other values or ranges of values.

Turning now to FIGS. 11-14, the mounting plate 10 will be further described. As shown in FIGS. 11 and 12, the electrical component plate assembly 16 is shown generally received into the pocket 12 of the mounting tray 10. In the example shown, the outboard plate 20 can occupy a position substantially flush with the lip 30 of the mounting tray 10. The mounting tray 10 can define a height $H_3$ taken from an inboard face of the rear wall 22 to the lip face 31 of the lip 30. The mounting plate 10 can further define a height $H_4$ from a peripheral edge 84 of the flange 26 to the lip face 31 of the lip 30. In one example, $H_3$ can be about 0.345 inch and $H_4$ can be about 0.125 inch. Again, it is appreciated that these dimensions are merely exemplary and others may be used. The electrical component plate assembly 16 can define a height $H_5$ of about 0.300 inch. As can be appreciated, the height $H_3$ can be greater than the height $H_5$ in one example such that the electrical component plate assembly 16 can suitably nest within the pocket 12. As illustrated in FIG. 12, the flange 26 extends from the sidewall 24 at a non-orthogonal angle. As will be described, the orientation of the flange 26 is particularly advantageous for accommodating tape and setting compound during installation.

As illustrated in FIGS. 13 and 14, the mounting plate 10 is shown relative to drywall 86 having a drywall face 87 and an opening 88 formed therein. The exemplary drywall 86 defines a thickness T. In one example, T can be 0.625 inches. It is appreciated that other thicknesses can be used. The mounting plate 10 is shown received into the opening 88 defined in drywall 86. It is appreciated by those skilled in the art that while this description is specifically directed toward drywall, the same teachings can be applied for mounting the mounting tray 10 relative to other non-drywall finishes, such as, but not limited to, wood, steel, tile, or marble. It is important to recognize that the mounting plate 10 is specifically designed to be located inboard of the opening 88 of the drywall 86. Explained differently, the mounting plate 10 is received entirely within a perimetral boundary defined by the opening 88 in the drywall 86. In one advantage, as will become appreciated by the following discussion, the mounting plate 10 can be securely positioned relative to a mud ring 90 (FIG. 15) and/or an electrical box 92 (also see FIG. 15) prior to positioning the drywall 86. The flange 26 can therefore provide a sloped transition from the lip 30 to the drywall 86. The height $H_4$ (FIG. 12) can thereby define an exposure height for accepting tape and/or setting compound. The flange 26 is not configured for placement over the drywall 86. The support members 50 (also see FIG. 2) preclude such installation of the flange 26 against the drywall face 87 of the drywall 86.

Figure 15:
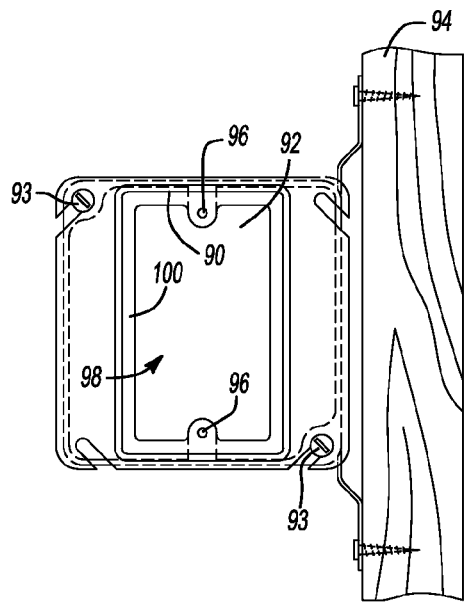
FIG. 15 is a front perspective view of an exemplary mud ring secured to an exemplary electrical box that is attached to a stud.
Figure 16:
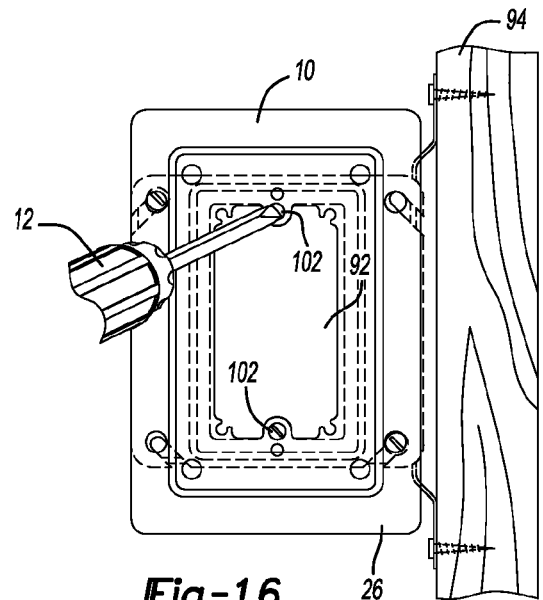
FIG. 16 is a front perspective view of the mounting plate of FIG. 1 being secured to the mud ring of FIG. 15.

With additional reference now to FIGS. 15-26, an exemplary method of installing the mounting tray 10 will be described in greater detail. FIG. 15 illustrates the exemplary mud ring 90 secured to the electrical box 92 by way of fasteners 93. The mud ring 90 and the electrical box 92 are operably secured to a stud 94. The mud ring 90 can define a pair of mounting apertures 96. An opening 98 is defined by an inner edge 100 of the mud ring 90. Turning now to FIG. 16, the mounting tray 10 can be secured to the mud ring 90. More specifically, a pair of fasteners 102 can be passed through the first pair of mounting passages 32 of the mounting tray 10 to couple with the mounting apertures 96 of the mud ring 90.

Figure 17:
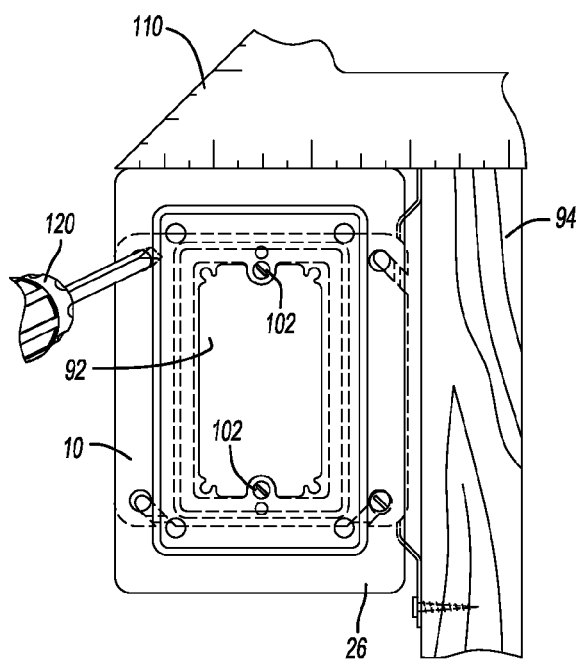
FIG. 17 is a front perspective view of the mounting plate secured to the mud ring and shown being aligned to a desired orientation with a tool.
Figure 18:
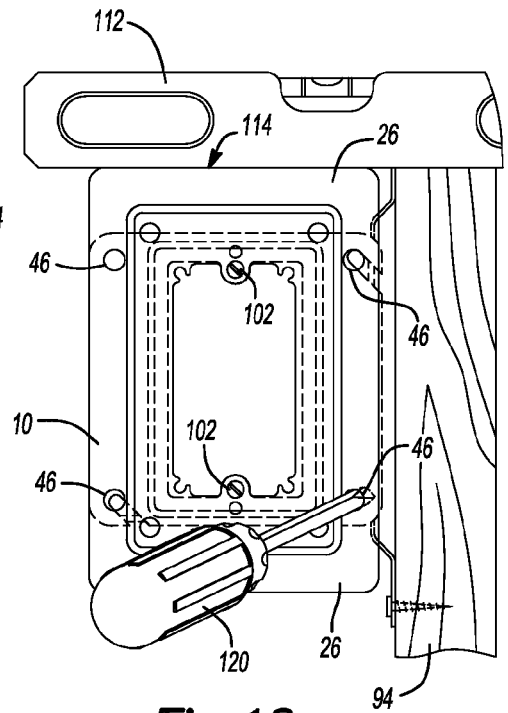
FIG. 18 is a front perspective view of the mounting plate shown attached to the mud ring and being aligned to a desired orientation with a tool while a user observes a level across the top edge of the mounting plate.

Turning now to FIGS. 17 and 18, various tools, such as a measuring device 110 (FIG. 17) and/or a level 112 (FIG. 18) can be used to position the mounting tray 10 in a generally upright orientation. More specifically, the tool 110 and/or 112 can be placed across an upper edge 114 of the flange 26 to align the edge 114 in an orientation generally horizontal with ground. In one example, a tool, such as a screwdriver 120 can be advanced through one of the alignment apertures 46 defined through the flange 26 to engage the fasteners 93 that secure the mud ring 90 relative to the electrical box 92. At least one of the fasteners 93 can be loosened with the screwdriver 120. As can be appreciated, moving the mud ring 90 relative to the electrical box 92 (i.e., in a clockwise and/or counterclockwise direction) will result in equal rotational movement of the mounting tray 10 until a horizontal (i.e., "plum") position is attained. Once a desired orientation is reached, the fastener(s) 93 can be tightened with the screwdriver 120.

Figure 19:
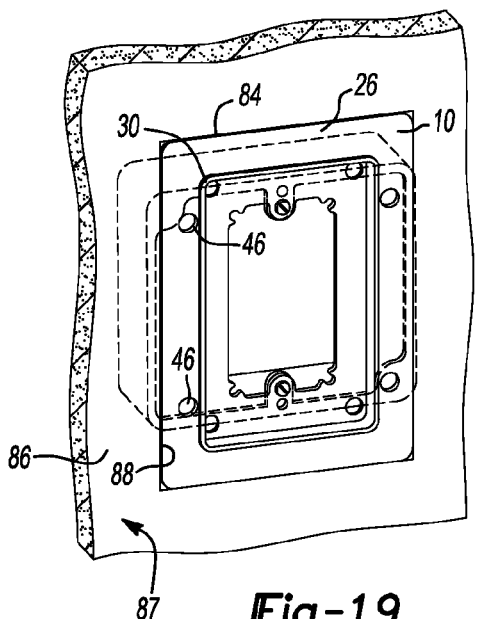
FIG. 19 is a front perspective view of the mounting plate shown extending through an opening in an exemplary wall.
Figure 20:
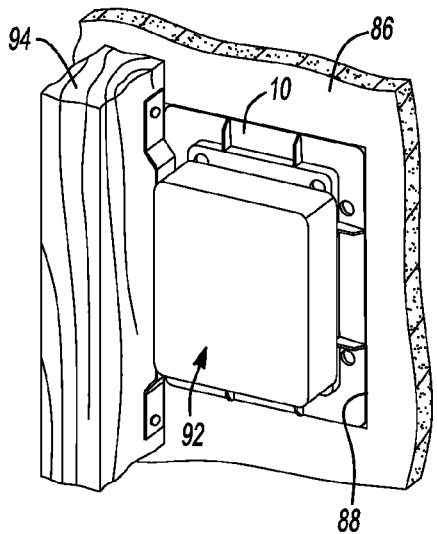
FIG. 20 is a rear perspective view of the mounting plate, secured to the mud ring and electrical box of FIG. 19 and extending through the opening in the wall.

Turning now to FIGS. 19 and 20, drywall 86 can then be located around the perimeter 84 of the flange 26. In one example, the opening 88 can be cut through the drywall 86 in a size that generally corresponds to the perimeter 84. The drywall 86 can then be advanced onto the studs 94, while aligning the perimeter 84 of the flange 26 with the opening 88. Again, the entire mounting tray 10 fits within a boundary defined by the opening 88.

Figure 21:
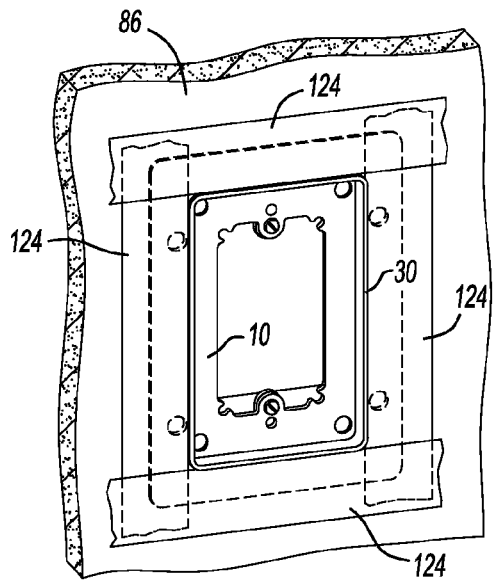
FIG. 21 is a front perspective view of the mounting plate installed relative to the wall and shown with tape being applied over an outer flange, across the opening in the wall and onto the surrounding wall.
Figure 22:
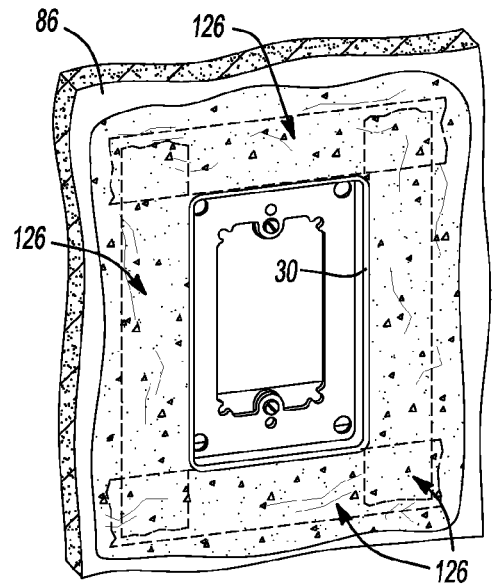
FIG. 22 is a front perspective view of the mounting plate in an installed position and shown after an application of setting compound applied over the tape and onto the surrounding wall.

Turning now to FIGS. 21-23, tape 124 can be applied across the flange 26 and the surrounding drywall face 87 of the drywall 86. As can be appreciated, the tape 124 can therefore extend from the flange 26, across the opening 88 and onto the face 87 of the drywall 86. Again, the sloped orientation of the flange 26 can facilitate a smooth, seamless transition from the lip 30 to the drywall face 87 of the drywall 86. Next, setting compound 126 can be applied from the lip 30 of the mounting tray 10, over the tape 124 and onto the drywall face 87 of the drywall 86. It is appreciated that prior to this step, one of the caps 54 and 70 can be securably mounted into the pocket 12 to inhibit accidental overspill of setting compound 126 into the mounting tray 10 (or in a location inboard of the lip 30). Those skilled in the art will appreciate that more than one application of setting material may be required to achieve a smooth surface finish adjacent to the lip 30. In this way, sequential and alternating steps of applying and sanding of the setting compound 126 may be required to attain a smooth surface finish appearance of the drywall 86.

With reference now to FIG. 24, the inboard plate 18 of the electrical component plate assembly 16 and the outlet 14 can be secured relative to the mounting tray 10. In one example, fasteners 128 can be inserted through passages 130 defined in the inboard plate 18 to couple with the second set of mounting passages 34 defined in the rear wall 22 of the mounting tray 10 (see FIG. 23). Fasteners 132 can be advanced through passages 134 defined in the inboard plate 18 to secure the outlet 14. In one example, fasteners 102 can be removed prior to driving the fasteners 132. As can be appreciated, the fasteners 102 can assist in holding the mounting tray 10 in place during installation of the drywall 86, tape 124 and setting compound 126.

Next, as shown in FIGS. 25A-25B, the outboard plate 20 of the electrical component plate assembly 16 can be coupled to the inboard plate 18. In one example, the outboard plate 20 can provide a snap fit onto the inboard plate 18. In one configuration a gap G (reveal) may be provided (laterally) between a perimeter of the lip 30 of the mounting tray 10 and the outboard plate 20. By way of example, the gap can be ⅛" (or other dimension) such that a pry tool may be inserted into the gap for "popping out" the outboard plate 20 from the inboard plate 18.

Figure 26A:
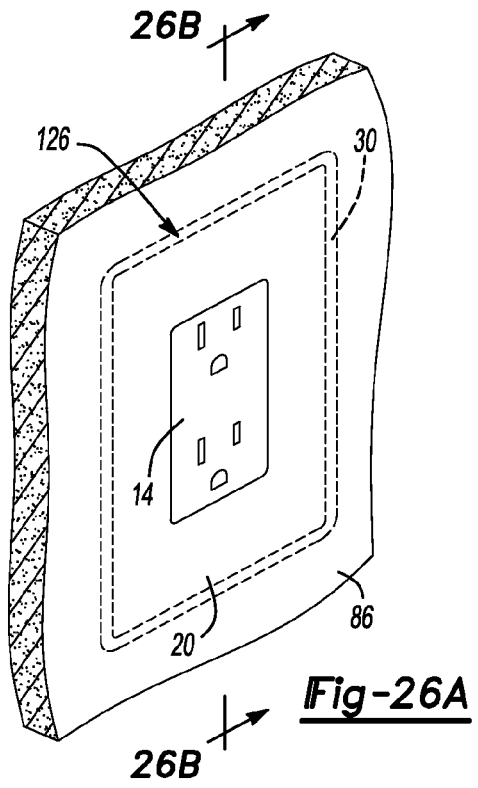
FIG. 26A is a front perspective view of the installed mounting plate, electrical component and electrical component plate assembly of FIG. 25.
Figure 26B:
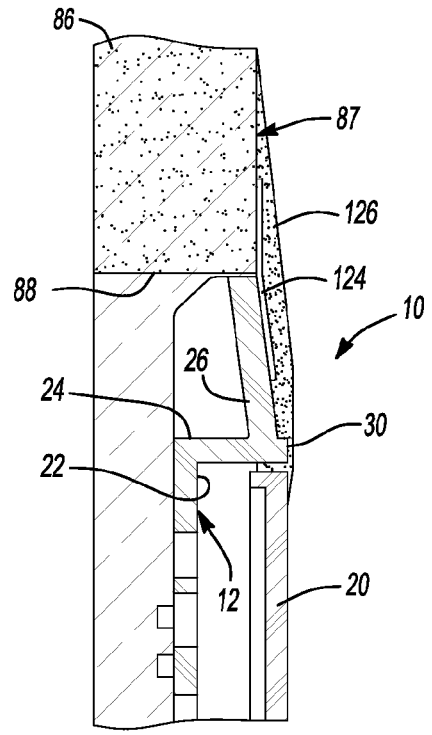
FIG. 26B is a cross-sectional view taken along lines 26B-26B of FIG. 26A.

With reference now to FIGS. 26A-26B, the mounting tray 10 and component plate assembly 16 are shown installed relative to drywall 86 according to another example. In the example shown in FIGS. 26A-26B, the settable compound 126 is applied similar to the example described above and also over the lip 30 of the mounting plate 10. As can be appreciated in this example, the gap or reveal (FIG. 25A) between the lip 30 of the mounting tray 10 and the outboard plate 20 can be eliminated.

Figure 27:
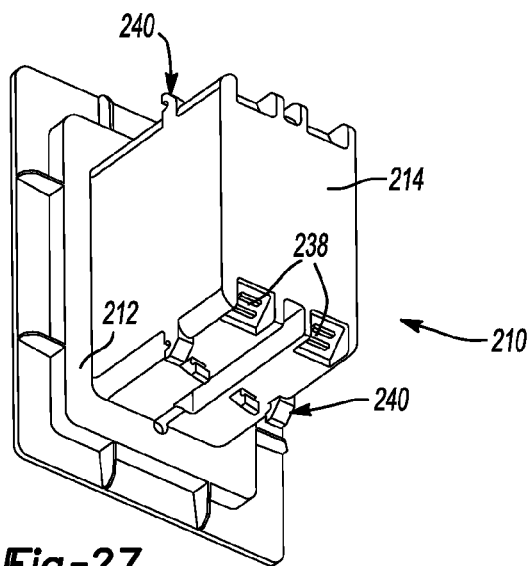
FIG. 27 is a rear perspective view of an exemplary integrally formed mounting tray and box assembly according to one example of the present disclosure.
Figure 28:
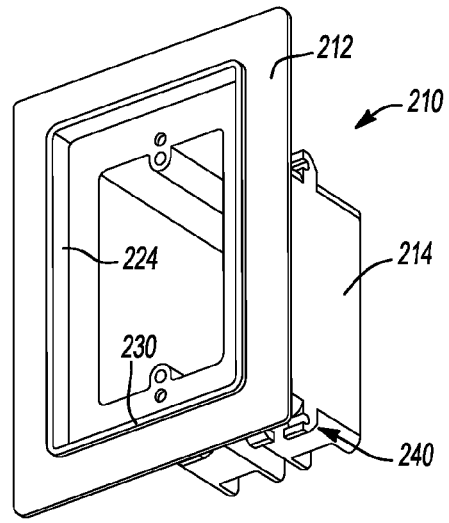
FIG. 28 is a front perspective view of the mounting plate and box of FIG. 33.

With reference now to FIGS. 27 and 28, a mounting tray 210 constructed in accordance to another example of the present teachings is shown. In general, the mounting tray 210 can provide an integrally formed mounting tray and electrical box component. Explained differently, the mounting tray 210 can incorporate the features of mounting tray 10 described above, as well as the electrical box 92 (FIG. 15). The mounting tray 210, therefore, can comprise a tray portion 212 and a box portion 214. The tray portion 212 can include a sidewall 224, a lip 230 and any other combination of features, such as described with respect to the mounting tray 10 described above. The box portion 214 can include any conventional features associated with an electrical box, such as, but not limited to, knock-out portions 238 and tabs 240. The knock-out portions 238 can be selectively removed as needed for passing electrical wires (i.e., Romex®, etc.) into the box portion 214. The tabs 240 can be formed on the box portion 214 for selectively receiving a fastener, such as a nail or a screw to attach the mounting tray 210 to a wall stud. In one configuration, the mounting tray 210 can be adjustable relative to drywall 86. In this way, the mounting tray 210 can move toward and away from a plane defined by the drywall after being secured to a wall stud 94. Of note, mounting apertures (such as the mounting apertures 46, FIGS. 1 and 2 of mounting tray 10) would not be required in the configuration of the mounting tray 210. The mounting tray 210 can be formed of any material, such as, but not limited to, plastic, metal such as steel, fiberglass or other materials, or others. While the mounting tray 210 is illustrated as single-gang, the mounting tray 210 can also be provided as dual-gang or multiple-gang configurations One suitable electrical component plate assembly 16 is manufactured by Lutron Electronics, Inc. of Coopersburg, Pa. One exemplary plate assembly provided by Lutron Electronics, Inc. is marketed under the trade name Claro™. It is appreciated that other electrical component plate assemblies including others provided by Lutron Electronics, Inc. can be used with the mounting tray 10 (and, or 210) according to the present teachings. It is also appreciated that while the above discussion has been directed to an outlet 14, the same can be applied for other electrical components, such as cable TV jacks, switches, telephone jacks, dimmers, fan switches, keypads, touch-screens, GFCI receptacle outlets, dual-gang, three-gang, and other multiple-gang outlets and others. By way of example, a kit or collection of mounting trays 310 are shown in FIG. 35 to illustrate the single-gang mounting tray with a dual-gang tray and multiple-gang tray. Other configurations are contemplated.

Figure 30:
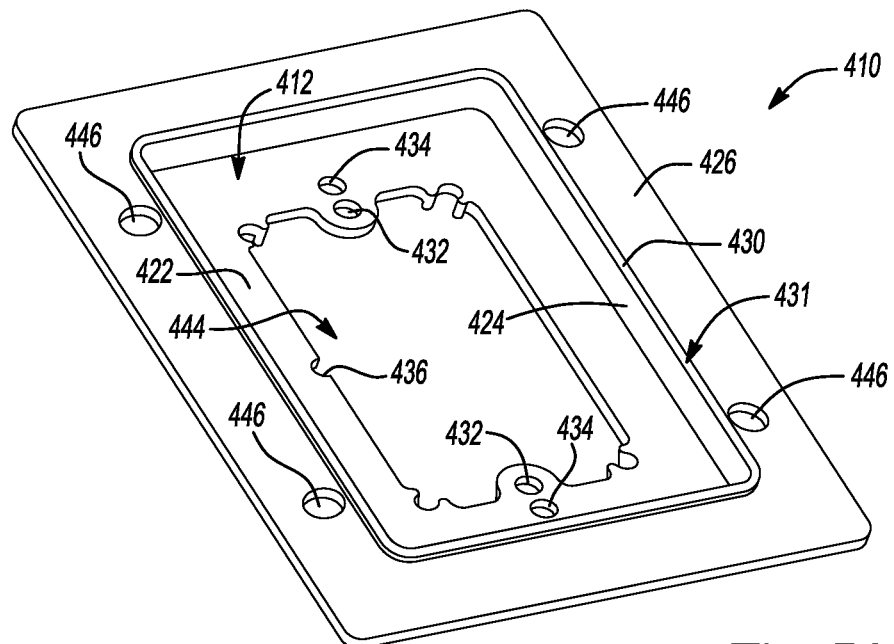
FIG. 30 is a front perspective view of a mounting tray according to additional features of the present disclosure.
Figure 31:
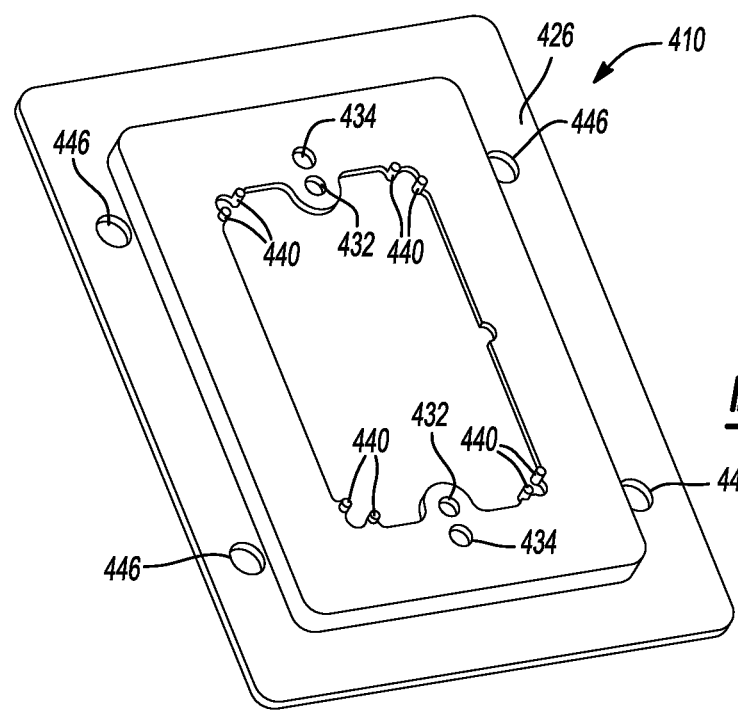
FIG. 31 is a rear perspective view of a mounting tray of FIG. 30.
Figure 33:
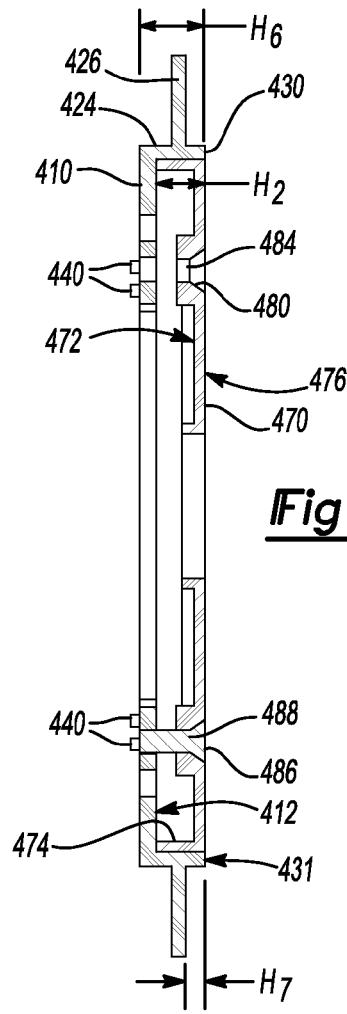
FIG. 33 is a sectional view taken along lines 33-33 of FIG. 32 and shown with the cap secured into the pocket of the mounting tray of FIG. 30.

With reference now to FIGS. 30, 31 and 33, a mounting tray constructed in accordance to additional features of the present teachings is shown and generally identified at reference numeral 410. In one example, the mounting tray 410 can include a rear wall 422, a sidewall 424 and a flange 426. The sidewall 424 can include two pair of opposing walls that collectively form a rectangular shape. The sidewall 424 can extend generally transverse to a plane defined by the rear wall 422. In one example, the rear wall 422 and the sidewall 424 can collectively define a pocket 412. The flange 426 can extend generally transversely (or at a 90° angle) relative to the sidewall 424.

The sidewall 424 can include a lip 430 that generally projects away from and extends above the flange 426. The sidewall 424 can have a height $H_6$. The lip 430 can define an outer face 431 and define a height $H_7$ from the outer flange 426. By way of example, the height $H_6$ can be 0.441 inch and the height $H_7$ can be 0.125. The flange 426 can have a textured surface to promote adhesion to tape and/or setting compound as will become appreciated herein. A plurality of locating posts 440 are provided in each of the corners defined by the pocket 424. An opening 444 can be defined through the rear wall 422. A plurality of alignment apertures 446 can be defined through the flange 426. Unless otherwise described herein, the features and mounting sequence of the mounting tray 410 can be utilized in a similar fashion as described above with respect to the mounting tray 10. The mounting tray 410 can also be provided in multiple-gang configurations (FIG. 29).

Figure 32:
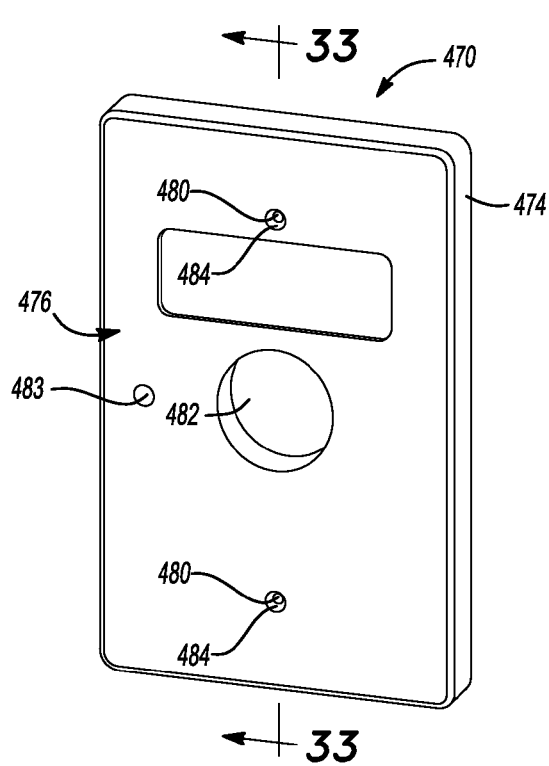
FIG. 32 is a front perspective view of a cap constructed in accordance with another example of the present teachings.

Turning now to FIGS. 32 and 33, a cap 470 constructed in accordance to another example of the present teachings is shown. As will become appreciated, the cap 470 can be used to selectively mate with the mounting tray 410 within the pocket 412 during installation of the mounting tray 410 to substantially inhibit material, such as settable compounds from entering the pocket 412. The cap 470 can generally include a rear face 472, a sidewall 474 and an outboard wall 476. A pair of mounting apertures 480, a central bore 482 and an aperture 483 can be defined through the mounting tray 470. The mounting apertures 480 can each have a countersink 484. The countersink 484 can be tapered as shown or can provide other geometry used to accept a head of a fastener, such as a head 486 of a fastener 488 in a nested or flush relationship with the outboard wall 476 as illustrated in FIG. 33. The cap 470 can be colored in a bright color such as red for example for a user to decipher a transition from the mounting plate 410 to the cap 470.

Figure 34:
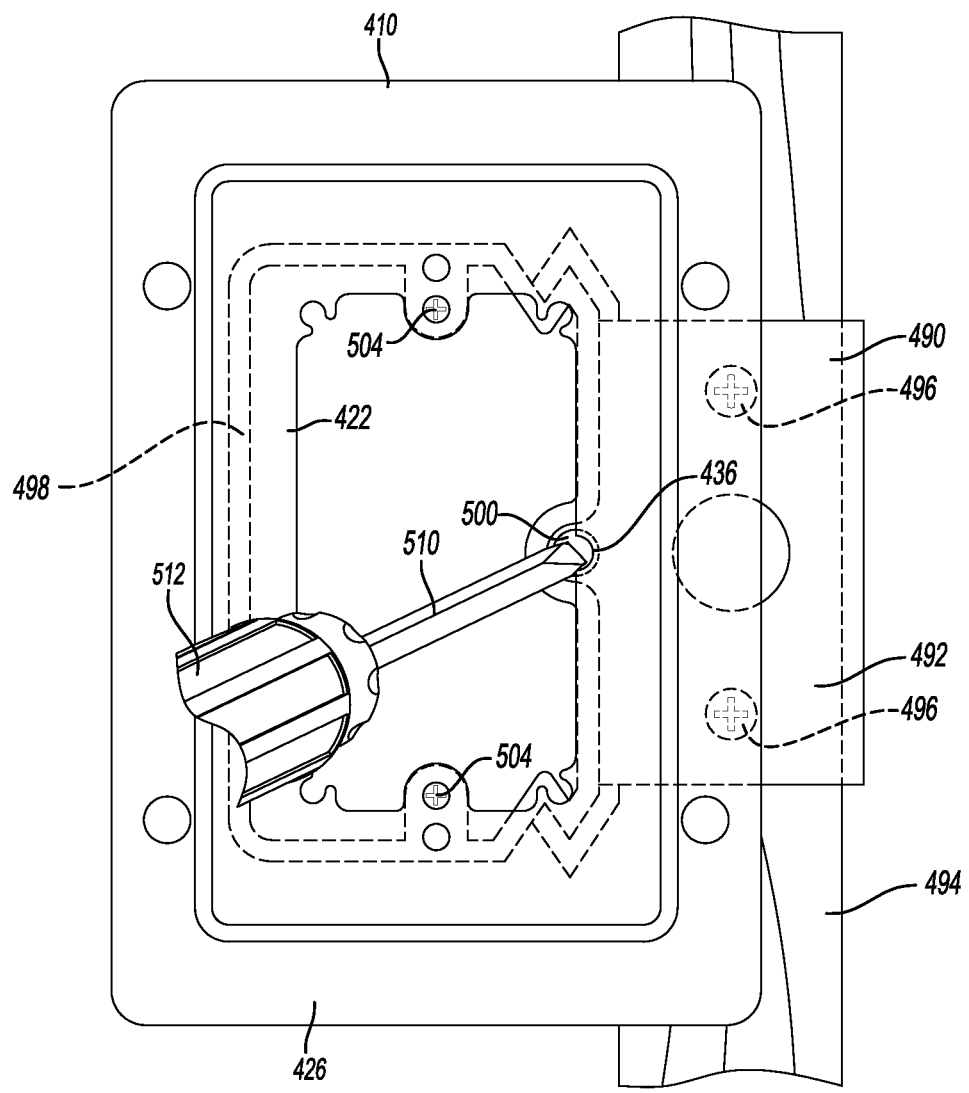
FIG. 34 is a plan view of the mounting tray of FIG. 30 and shown with an assembly tool passing through a cutout of the mounting tray to access a fastener associated with an adjustable electrical box according to one example of the present teachings.

Turning now to FIG. 34, the mounting tray 410 is shown cooperatively attached to an adjustable electrical box 490. The adjustable box 490 can generally include a plate 492 that can be fixed relative to a stud 494, such as by fasteners 496. The plate 492 can be adjustably fixed to a box 498. In this regard, a fastener 500 can be rotated to adjust the position of the box 498 relative to the plate 492. Explained further, rotation of the fastener 500 can cause the box 498 to translate inwardly and outwardly relative to the stud 494, such that a user can locate the box 498 in a desired location relative to the stud 494 (and ultimately the drywall). One exemplary adjustable box is manufactured by Carlon of Brookfield, Wis. The mounting plate 410 can be securely fixed relative to the box 498, such as by way of fasteners 504. A user can adjust the fastener 500 connected between the plate 492 and the box 498 by locating a shaft 510 of a tool, such as a screwdriver 512 through the cutout 436 provided in the rear wall 422 of the mounting tray 410. While not specifically shown, it can be appreciated that in this step, a user can also manipulate the fastener 500 with the tool 512 when the cap 470 is secured to the mounting tray 410. In this regard, a user can pass the shaft 510 of the tool 512 through the aperture 483 (FIG. 32) of the cap 470 in addition to passing the shaft 510 through the cutout 436 in order to gain access to the fastener 500. Other configurations are contemplated.

While the disclosure has been described in the specification and illustrated in the drawings with reference to a preferred embodiment, it will be understood by those skilled in the art that various changes may be made and equivalents may be substituted for elements thereof without departing from the scope of the disclosure as defined in the claims. In addition, many modifications may be made to adapt a particular situation or material to the teachings of the disclosure without departing from the essential scope thereof. Therefore, it is intended that the disclosure not be limited to the particular embodiment illustrated by the drawings and described in the specification as the best mode presently contemplated for carrying out this disclosure, but that the disclosure will include any embodiments falling within the description of the appended claims.

What is claimed is:

1. A method for installing an electrical component relative to an opening in a wall, the method comprising:
providing a mounting tray having a rear wall defining an opening, a sidewall and an outer flange, the sidewall extending outwardly from the rear wall to an outer lip having an outer face and collectively defining a pocket with the rear wall, the outer flange extending around the sidewall from a first location at the sidewall to a second location at an outer perimeter of the outer flange, wherein the outer perimeter of the outer flange is offset inboard of the opening in the wall in an installed position;
securing the mounting tray relative to a mud ring;
subsequently locating drywall around a perimeter of the outer flange;
applying tape across the flange and surrounding drywall;
positioning an installation cap into the pocket, the installation cap having a sidewall and an outboard wall, such that the outboard wall is substantially flush with the outer face of the outer lip of the mounting tray, and providing a barrier for the installation cap to inhibit setting compound from entering into the pocket during installation of the mounting tray;
applying setting compound over the tape and onto at least a portion of the drywall such that the setting compound provides a flush transition from the outer lip to the drywall;
securing an electrical outlet within the pocket; and
securing an outboard plate to the mounting tray, the outboard plate having a substantially flush elevation relative to the outer lip.

2. The method of claim 1, further comprising:
securing the electrical box to a wall stud; and
securing the mud ring to the electrical box with a fastener.

3. The method of claim 1 wherein applying the tape comprises:
applying the tape such that it spans from the outer flange, across a gap defined between the mounting plate and the drywall, to the drywall.

4. The method of claim 1, further comprising:
sanding the setting compound to attain a seamless transition from the outer lip to the drywall.

5. A mounting tray assembly for supporting an electrical component relative to an opening in a wall, the mounting tray assembly comprising:
a mounting tray including:
a rear wall defining an opening;
a sidewall extending outwardly from the rear wall to a lip having an outer face, the sidewall and rear wall collectively defining a pocket; and
an outer flange extending around the sidewall from a first location at the sidewall to a second location at an outer perimeter of the outer flange, wherein the outer perimeter of the outer flange is offset inboard of the opening in the wall in an installed position; and
an installation cap including:
a sidewall and an outboard wall, the installation cap configured to be inserted into the pocket of the mounting tray in an assembled position such that the outboard wall is substantially flush with the outer face of the lip, the installation cap providing a barrier to inhibit setting compound from entering the pocket during installation of the mounting tray.

6. The mounting tray assembly of claim 5 wherein the mounting tray defines a cutout in the rear wall and the installation cap defines an aperture through the outboard wall, wherein the cutout and aperture align to accept a tool therethrough in the assembled position, the tool operable to engage a fastener associated with an adjustable electrical box.

\* \* \* \* \*